United States Patent [19]

Rosvold

[11] 3,911,474

[45] Oct. 7, 1975

[54] SEMICONDUCTOR STRUCTURE AND METHOD

[75] Inventor: Warren C. Rosvold, Sunnyvale, Calif.

[73] Assignee: Signetics Corporation, Sunnyvale, Calif.

[22] Filed: July 30, 1973

[21] Appl. No.: 381,040

Related U.S. Application Data

[63] Continuation of Ser. No. 214,589, Jan. 3, 1972, abandoned.

[52] U.S. Cl. ...................................... 357/71; 357/67

[51] Int. Cl.² .................... H01L 23/48; H01L 29/46

[58] Field of Search ....................... 317/234, 5.3, 5.4

[56] References Cited

UNITED STATES PATENTS

| | | | |
|---|---|---|---|
| 3,528,090 | 9/1970 | Van Laer | 204/15 |
| 3,560,358 | 2/1971 | Black | 204/143 |
| 3,616,348 | 10/1971 | Greig | 204/143 R |
| 3,751,292 | 8/1973 | Kongable | 357/71 |

*Primary Examiner*—Michael J. Lynch
*Assistant Examiner*—E. Wojciechowicz
*Attorney, Agent, or Firm*—Flehr, Hohbach, Test, Albritton & Herbert

[57] ABSTRACT

Semiconductor structure formed of a semiconductor body having a planar surface and having regions of first and second conductivity types extending to the surface and with a layer of insulating material formed on the surface. The layer of insulating material has openings formed therein exposing portions of said regions. A lead structure is adherent to the layer of insulating material and extends through the openings to make contact to the portions of the regions so that the regions form parts of an integrated circuit. The lead structure includes a layer of gold having a relatively rough surface with a roughness scale ranging from 10 to 20 microinches so that photoresist will readily adhere thereto.

In the method for forming a semiconductor structure, the layer of gold having a relatively rough surface is utilized so that photoresist will readily adhere thereto to permit the formation of a lead structure in accordance with a predetermined pattern.

7 Claims, 13 Drawing Figures

INVENTOR.
Warren C. Rosvold
BY Flehr, Hohbach, Test, Albritton & Herbert
Attorneys INVENTOR.
Warren C. Rosvold
BY Flehr, Hohbach, Test, Albritton & Herbert
Attorneys

SEMICONDUCTOR STRUCTURE AND METHOD

This is a continuation of application Ser. No. 214,589, filed Jan. 3, 1972 now abandoned.

BACKGROUND OF THE INVENTION

1. Field of the Invention

This invention relates to the formation of a lead structure for a semiconductor structure using multi-layers of gold in the lead structure.

2. Description of Prior Art

In integrated circuits, metal interconnections in the form of aluminum have been used extensively. However, it has been found that great difficulty is encountered when depositing aluminum over steps in the semiconductor structure greater than 2 microns in depth. Gold has heretofore been utilized in beam lead metallurgy. For such purposes, the gold has been sputtered on. In the past, it has been very difficult to utilize photoresist with gold because the photoresist adheres very poorly to the gold. There is, therefore, a need for a new and improved semiconductor structure and method which overcomes these difficulties.

SUMMARY OF THE INVENTION AND OBJECTS

The semiconductor structure is formed of a semiconductor body which has a planar surface. The semiconductor body is provided with regions of first and second conductivity types extending to the surface. A layer of insulating material is formed on the surface and has openings formed therein exposing portions of said regions. A lead structure is provided which is adherent to said layer of insulating material and extends through the openings to make contact to said portions of said regions so that regions form parts of an integrated circuit. The lead structure includes a layer of gold which has a relatively rough surface having a roughness ranging from 10 to 20 microinches so that photoresist will readily adhere thereto.

In the method, the photoresist is utilized for delineating a pattern for the formation of the lead structure in accordance with a predetermined pattern.

In general, it is an object of the present invention to provide a semiconductor structure and method in which a layer of gold is provided having a relatively rough surface to which photoresist will readily adhere.

Another object of the invention is to provide a semiconductor structure and method which can be utilized with all types of semiconductor devices such as bipolar and MOS.

Another object of the invention is to provide a semiconductor structure and method of the above character in which lead structures can be provided over steps having depths greater than 2 microns.

Another object of the invention is to provide a semiconductor structure and method of the above character which can be utilized with beam leads.

Another object of the invention is to provide a semiconductor structure and method of the above character in which high yields can be obtained.

Additional objects and features of the invention will appear from the following description in which the preferred embodiment is set forth in detail in conjunction with the accompanying drawing.

DESCRIPTION OF THE PREFERRED EMBODIMENT

The method for fabricating the semiconductor structure incorporating the present invention is shown in FIGS. 1–13. A semiconductor body 16 is provided and may be in the conventional form of a 2 inch or 3 inch wafer formed of a suitable semiconductor material such as silicon. With the particular method herein described, it is necessary that the planar surface 17 of the semiconductor body 16 have a surface orientation in the <100> crystal plane.

Figures 1, 2, 3, 4, 5, 6, 7:
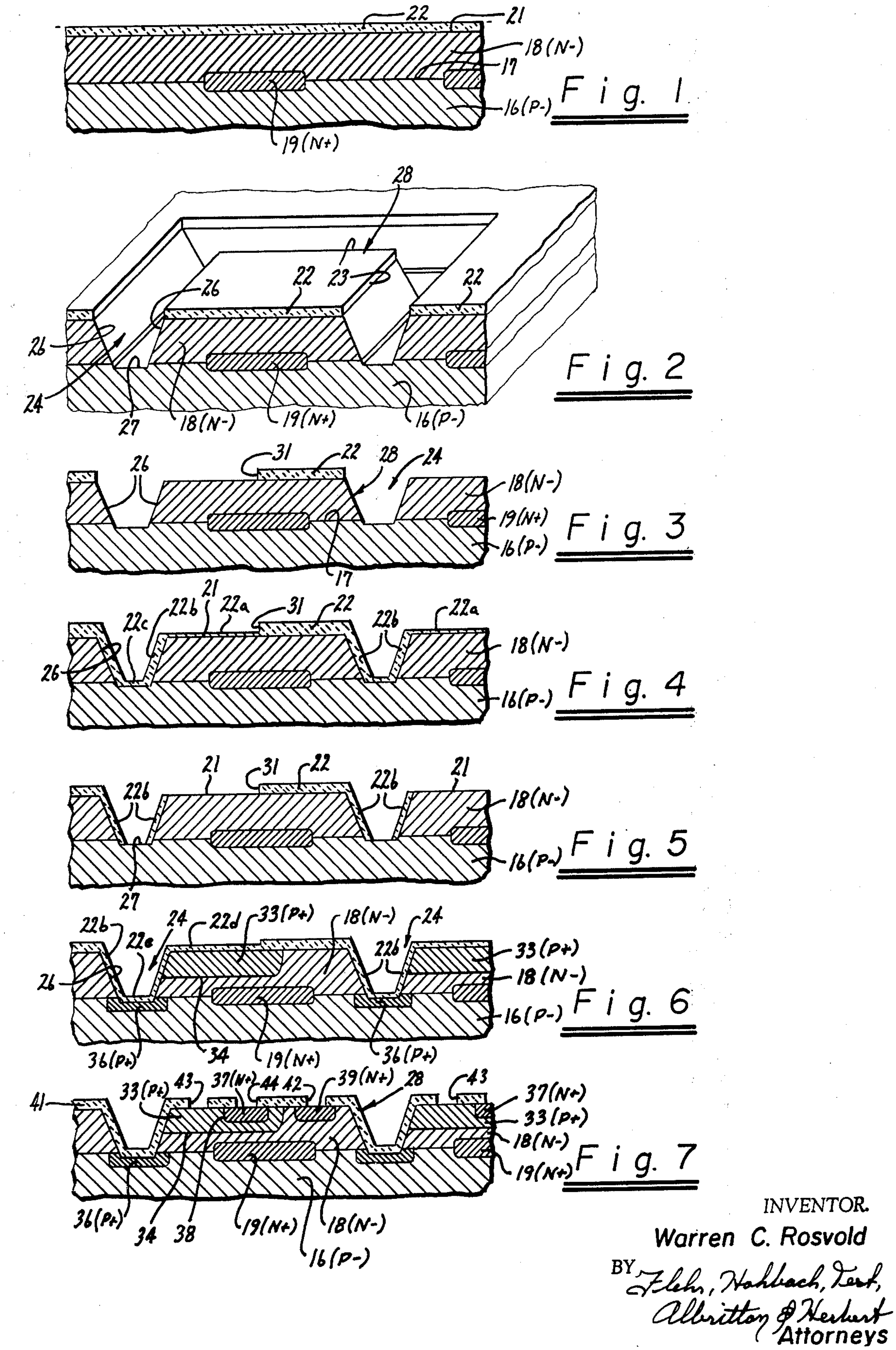
FIGS. 1 through 13 are cross-sectional views showing the steps utilized in fabricating a semiconductor structure incorporating the present invention.

As shown in FIG. 1, the semiconductor body 16 can be doped with a suitable impurity such as a P— impurity throughout the same. An epitaxial layer or region 18 is formed on the surface 17 of the semiconductor body in a manner well known to those skilled in the art and is preferably doped with a suitable impurity such as an N— impurity. For the formation of bipolar devices as hereinafter described, it is desirable that there be provided an N+ region 19 normally called a buried layer. The formation of such a buried layer is well known to those skilled in the art. For example, it can be formed before the epitaxial layer is provided by providing a suitable mask (not shown) on the surface 17 as, for example, a layer of silicon dioxide in which windows or openings (not shown) are formed and an N type impurity diffused therethrough to provide N+ regions 19. The silicon dioxide layer is then stripped and the epitaxial layer 18 is formed thereon. During the epitaxial process, the N+ layers 19 will diffuse upwardly into the epitaxial layer 18 as shown.

The epitaxial layer 18 is provided with a planar surface 21 parallel to the surface 17 which is covered with a masking layer 22 formed of a suitable material such as silicon dioxide. Windows or openings 23 are then formed in the silicon dioxide layer 22 by suitable photolithographic means to expose the surface 21 of the epitaxial layer 18. The windows or openings 23 can have any suitable geometry such as circular or rectangular to provide regions which are surrounded or encircled by the window or opening to form isolated islands as hereinafter described.

As soon as the windows or openings 23 have been formed to expose the surface 21 with the epitaxial layer 18, an anisotropic etch is utilized to selectively etch away the silicon epitaxial layer 18 and the layer 16 utilizing the silicon dioxide layer as a mask. As is well known to those skilled in the art, such an anisotropic etch produces rectangular grooves or moats 24 which are generally in the form of V-shaped slots in cross-section in which the inside walls 26 forming the "V" make a 54° angle with the surface 21 along the <111> planes. In the present method, it is important that the width of the windows or opening 23 be sufficiently large so that the moats 24 can be etched to a depth which is below the P-N junction 17 between the P type body 16 and the N type epitaxial layer 18, and still have a planar bottom wall 27 which has a surface orientation in the 100 plane the same as the surface 21. As is well known to those skilled in the art, such an anisotropic etch does not undercut the silicon dioxide layer 22 and thus produces well defined channels or moats to provide air gap isolation for the islands 28 formed by the moats 24. Thus, it can be seen that the width of the openings or windows 23 must be such that the V-shaped moats will not come to an apex before the desired depth has been reached.

After the moats 24 have been formed as shown in FIG. 2, additional openings 31 are formed in the silicon dioxide layer 22 and also can have the desired geometry such as rectangular or circular to provide openings through which impurities can be diffused for the formation of the base regions of the bipolar devices in the islands 28 as shown in FIG. 3.

After the openings 31 have been formed, the structure shown in FIG. 3 is placed in a furnace in an oxidizing atmosphere to cause the formation of additional silicon dioxide on the structure. The oxidation is carried out at a relatively low temperature ranging from between 900° to 920°C. so that there is a differential growth of silicon dioxide on the exposed surfaces lying in a <100> plane and <111> planes, respectively. When utilizing such oxidizing temperatures, the silicon dioxide grows more rapidly on the side walls 26 which lie in the <111> plane than on the walls which lie in the <100> plane as, for example, the bottom walls 27 of the moats 24 and the surface 21. This differential growth rate begins to disappear as the temperature is increased substantially above 920°C. until there is no appreciable difference at 1,200°C. This difference in growth rate of the silicon dioxide layer is shown in FIG. 4 in which the original silicon dioxide layer 22 has been grown slightly thicker, whereas the portion **22*a* overlying the exposed surface 21 lying in the <100> plane is quite thin in comparison and in which the portion 22*b* on the side walls 26 is significantly thicker in the range of 1,000 Angstroms or more and the portion 22*c* overlying the flat bottom wall 27 in the <100> plane is substantially thinner and approximately the same thickness as the portion 22*a*.**

After the oxidizing operation has been completed, the structure is subjected to etch which selectively attacks the silicon dioxide layer 22. Preferably, a dilute etch should be utilized so that the etching will proceed slowly. The structure is subjected to the etch for a time which is just sufficient to entirely remove the thinner portions **22*a* and 22*c* of the silicon dioxide layer 22 while still leaving portions 22*b* adhering to the side walls 26 and portions of the original layer 22 as shown in FIG. 5. Thus, the bottom walls 27 of the moats 24 and the surface 21 in the windows 31** are exposed.

A P type impurity is then diffused through the exposed surfaces 27 and 21 to form P+ base regions 33 which are defined by dish-shaped P-N junctions which extend to the surface and to the side wall 26 of the moat 24. There also are provided P+ diffused regions 36 which extend downwardly from the surface 27 and which extend outwardly and upwardly so they at least reach P-N junction 17. As shown, the regions 36 are also substantially dish-shaped in cross-section. During the formation of the P+ regions, thin layers of silicon dioxide grow on the surfaces 21 and 27 as indicated by the portions **22*d* and 22*e*.**

After the P+ diffusion has been carried out, an N type diffusion is carried out for the formation of the emitter regions of the bipolar devices. This is carried out in a conventional manner as, for example, by forming additional openings (not shown) in the silicon dioxide layer 22 in the appropriate locations and then diffusing the N type impurity through the openings to form N+ regions 37 within the P+ regions 33 and which are defined by dish-shaped P-N junctions 38 which extend to the surface 21. At the same time, it is conventional to provide additional openings (not shown) in the silicon dioxide layer 22 through which the N type impurity is also diffused to form N+ collector contact regions 39. Thus, it can be seen that regions of first and second conductivity types are provided which extend to the surface 21.

After the N+ diffusion has been carried out, the silicon dioxide layer which remains is stripped and a new silicon dioxide layer 41 is grown in an oxidizing atmosphere. This silicon dioxide layer 41 is grown at a relatively high temperature so that it has a relatively uniform thickness throughout. Contact openings 42, 43 and 44 are formed in the silicon dioxide layer 41 to expose the surface 21 and to provide contact to the collector, base and emitter regions, respectively, of each of the bipolar devices within the islands 28.

Figures 8, 9, 10, 11, 12, 13:
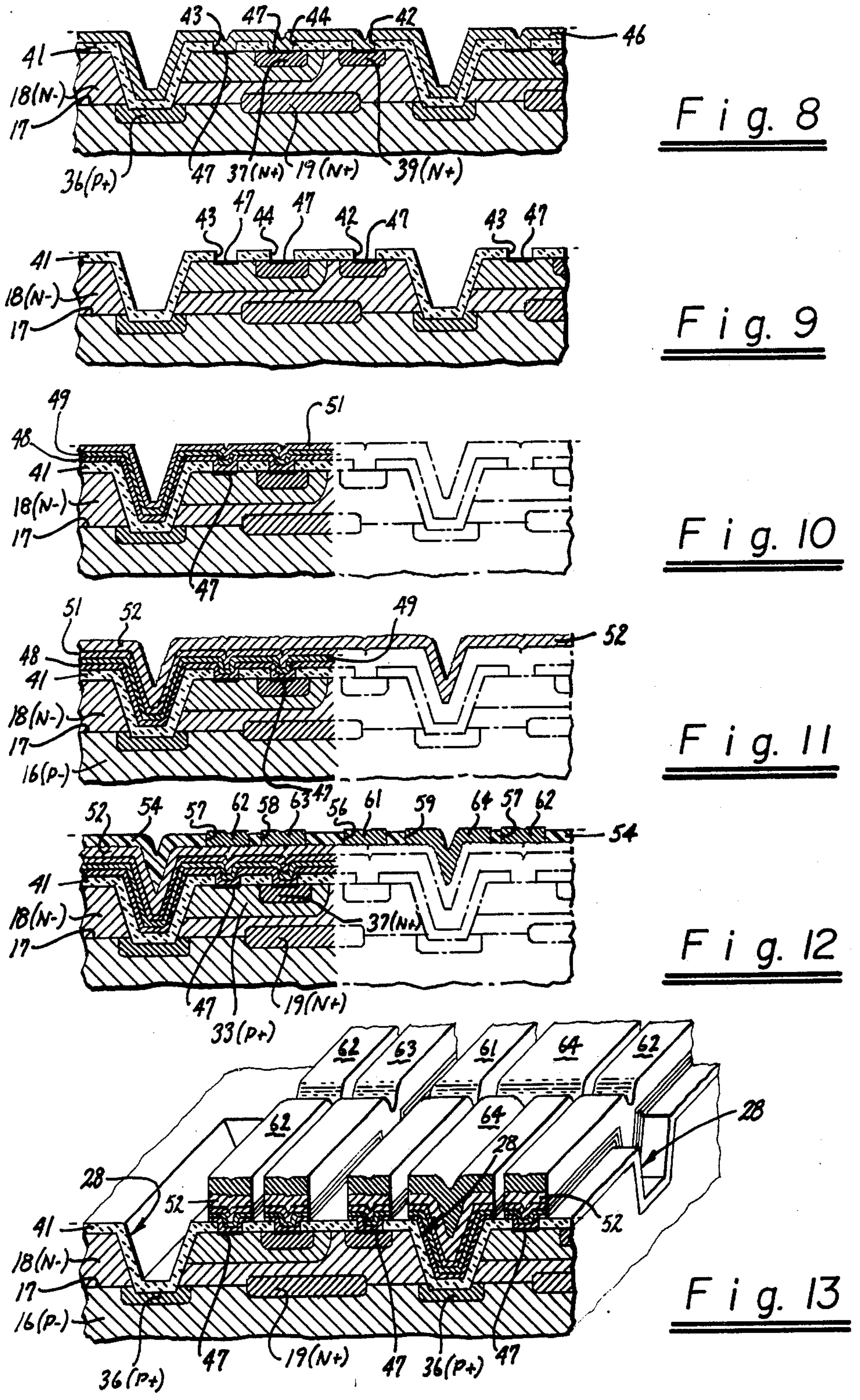

As shown as the contact openings have been formed, a metal layer 46 formed of a suitable material is deposited on the silicon dioxide layer 41 and extends into the openings 42, 43 and 44 to make contact with the exposed regions as shown in FIG. 8. As described in copending application Ser. No. 214,590, filed Jan. 3, 1972, it is desirable to utilize a mixture of platinum and nickel which is sputtered onto the exposed surface of the structure shown in FIG. 8 with nickel constituting 75 to 90% of the mixture and platinum constituting the balance. As explained in said copending application, it has been found that a ternary alloy is formed with the silicon in which the alloy constitutes approximately 50% silicon, 37½ to 45% nickel, and the balance platinum, at a temperature of approximately 350°C. Typically, the metal layer is deposited to a thickness ranging from 500 to 1,000 Angstroms and preferably a thickness of approximately 750 Angstroms to provide ternary alloy regions 47 of approximately the same depth. The reaction is carried out in a vacuum which is greater than $5\times10^{-6}$ Torr. and can be performed in a period of time ranging from 2 min. to approximately 2 hours depending upon the physical conditions encountered. There is a solid-solid reaction in which all the available platinum and nickel is combined with the silicon in the windows to form the regions 47. All of the remaining portions of the metal layer 46 are chemically removed in a suitable etch such as sulphuric acid solution utilizing three parts of water by volume to 7 parts of sulphuric acid by volume. The ternary alloy regions 47 are inert to this solution and are not affected by it. There thus remains the structure which is shown in FIG. 9 in which the ternary alloy regions 47 in the contact windows or openings 42 and 43 remain and the metal has been removed.

After the structure shown in FIG. 9 has been completed, a number of layers, namely layers 48, 49 and 51, are formed by a deposition in situ of a layer 48 of titanium of suitable thickness as, for example, 1,000 Angstroms, a layer 49 of platinum of a suitable thickness such as 3,000 Angstroms and a layer 51 of gold of approximately 1,000 Angstroms in thickness. These three layers are deposited one after another in a vacuum, preferably greater than $5\times10^{-6}$ Torr by R.F. sputtering or by electron gun evaporation. The bottom layer of titanium is used to promote adhesion to the ternary alloy regions 47. The platinum layer is provided to isolate the gold from diffusing into the junction areas of the semiconductor body and the gold layer is provided to form a good conductor and is also used to make possible easy electro-forming of thicker gold interconnections as hereinafter described without depolarization and lack of adhesion.

Thus, after the connecting conducting laminous formed of the three layers 48, 49 and 51 have been formed, the entire surface of the structure or wafer shown in FIG. 10 is placed in a gold plating solution and electrical contact is made to the wafer from either the front or the back side. The electro-plating bath is maintained at a suitable temperature as, for example, between 25° and 35°C. and is continuously agitated in a suitable manner such as by a magnetic stirrer. The wafer is plated at a current density of 3 amps/sq. ft. for a sufficient period of time to plate an electroformed layer 52 of a suitable thickness as, for example, between 3800 and 6000 Angstroms with the preferred range being between 3800 and 4200 Angstroms onto the gold layer 51. The principal purpose for providing the electroformed layer 52 is to provide a roughened surface to make possible better adhesion of the photoresist. By experimentation, it has been found that when the gold layer 52 is below approximately 3800 Angstroms in thickness, it is too smooth and the photoresist will not adhere properly. As the layer 52 becomes thicker, its surface becomes rougher. However, when the thickness approaches 6000 Angstroms, the surface becomes too rough to make possible the fine delineation which is required in making integrated circuits using the present invention. In addition, there is a disadvantage in that it requires more time to plate on the additional thickness and it also requires a longer time to remove the electroformed gold in the subsequent steps.

Examining the surface of the layer of gold under electron microscope, it has been found that the surface in fact is relatively rough and uniform throughout and that the surface has a roughness scale ranging from 10 to 20 microinches. In the 10 microinch region, the average delineation is approximately one-quarter of a micron. By this, it is meant that there are hillocks and valleys which are approximately one-quarter of a micron apart and which have depths of valleys or heights of hillocks of approximately one-quarter of a micron.

At the present time, it is believed that this gold layer 52 with the roughened surface can only be obtained in an electroforming operation. This is because during electron beam evaporation or R.F. sputtering or thermal evaporation, the deposition of the gold mirrors the surface finish. Since the silicon dioxide layer 41 has a very smooth surface, this surface will be mirrored by the layers 48, 49 and 51 and for that reason the surface smoothness will not vary greatly from the very smooth surface of the silicon dioxide and, therefore, it is very difficult to obtain good adhesion of the photoresist to the gold layer.

On the other hand, the electroplating of gold onto the gold layer 51 serves to promote roughness and thus, in turn, promote mechanical adhesion of the photoresist thereafter deposited thereon. It is believed that the roughened surface on the gold is obtained in the electroplating operation because even on an ideal mirror-like surface such as provided by the silicon dioxide, there are certain peaks and valleys. During the electroplating operation, a greater electric field is created at the peaks so that there is a higher deposition rate of the gold at the peaks than in the valleys. Thus, the peaks and valleys are accentuated as the electroplating continues which explains why the surface of the gold becomes rougher and rougher as the electroplated layer becomes thicker. The electroplating of the layer 52 onto the layer 51 has another desired result in that it serves to round the edges of the anisotropic etched channels or moats 24. This occurs because there is preferential plating created by the greater electric field over this sharp edge. Thus, by way of example, the plating over this sharp edge may be 10% greater than in the field area so that the thickness of the plating over the edge gives a rounded effect which promotes adhesion of the photoresist.

After the electroplating operation has been completed, a layer 54 of a suitable photoresist such as a positive resist or a negative resist is formed on the roughened surface of the plated gold layer 52 such as by depositing the photoresist onto the surface 52 and then spinning the wafer to remove the excess photoresist. The photoresist is then dried in a conventional manner. It has been found that all types of photoresists adhere very well to this layer of gold having a roughened surface. For example, it has been found that all the Eastman Kodak photoresists such as KTFR and KMER readily adhere to such roughened surfaces. The same has been found to be true with respect to positive photoresists such as the Shipley AZ Series.

Thereafter, the photoresist is exposed to ultra-violet light through a suitable mask. It is then developed and the undesired photoresist is removed to provide openings 56, 57, 58 and 59 in the form of stripes to expose the plated gold layer 52 in particular areas where it is desired to form leads. The structure which is normally in the form of a wafer is then placed on a plating rack which is disposed in the same gold solution and is plated for a suitable period of time as, for example, 15 minutes at a current density ranging from 3 to 8 amperes per sq. ft. to form leads 61, 62, 63 and 64 having a thickness of 4 to 6 microns which can be formed in approximately 15 minutes. As shown, the leads 61, 62 and 63 make contact with the collector, base and emitter regions respectively of a bipolar transistor, whereas the lead 64 can be utilized as an interconnecting lead for interconnecting an integrated circuit of which the bipolar transistors may form a part.

After the leads 61–64 have been formed to the desired thickness, the structure is removed from the plating bath and all the materials remaining in the field are stripped off. The photoresist layer 54 is dissolved in an appropriate organic stripper. The 4000 Angstrom plated gold layer 52 and the gold layer 51 are stripped in a suitable solution such as potassium iodide. The platinum layer 49 underlying the gold is removed by R.F. sputter etching. The remaining bottom layer 48 of titanium is stripped in a solution of sulphuric acid. This completes the delineation of the interconnection pattern which, as shown, bridges over the trenches or moats 24. As shown, additional leads such as leads 64 can be provided for interconnecting active and passive devices which may be utilized to form an integrated circuit.

Although the present method has been described in conjunction with the formation of bipolar integrated circuits, it is readily apparent that the present method is also applicable to other types of devices. For example, the method would be applicable to silicon gate MOS technology. The lead structure herein disclosed using the roughened electroformed gold could be utilized in place of aluminum lead structures to provide excellent contact and lead structures even though the steps encountered may exceed 2 microns.

It should be appreciated that one of the principal features of the present invention is that it makes it possible to obtain good adherence of photoresist to gold which eliminates one of the most serious problems heretofore encountered in the formation of leads formed of gold.

I claim:

1. In a semiconductor structure, a semiconductor body having a planar surface and having regions of first and second conductivity types extending to said surface, a layer of insulating material formed on said surface, said layer having openings therein exposing portions of said regions, a lead structure adherent to said layer of insulating material and extending through said openings to make contact to said portions of said regions so that said regions form parts of an integrated circuit, said lead structure including a first layer of gold having a relatively rough surface with a roughness scale ranging from 10 to 20 microinches so that photoresist will readily adhere thereto, and a layer of photoresist adherent to said relatively rough surface of said gold layer.

2. A semiconductor structure as in claim 1 wherein said first layer of gold has a thickness ranging from 3,800 to 6,000 Angstroms.

3. A semiconductor structure as in claim 1 wherein said first layer of gold has a thickness ranging from 3,800 to 4,200 Angstroms.

4. A semiconductor structure as in claim 1 wherein said lead structure includes a plurality of metal layers underlying said first layer of gold having a relatively rough surface.

5. A semiconductor structure as in claim 4 wherein said plurality of metal layers underlying said first layer of gold having a relatively rough surface includes a layer of titanium, a layer of platinum and a layer of gold.

6. A semiconductor structure as in claim 5 wherein said layer of titanium has a thickness of approximately 1000 Angstroms, said layer of platinum has a thickness of approximately 3000 Angstroms and said layer of gold has a thickness of approximately 1000 Angstroms.

7. A semiconductor structure as in claim 1 wherein said first layer of gold having a relatively rough surface is in the form of electroformed gold.

* * * * *